(12) United States Patent
Maushard et al.

(10) Patent No.: US 6,933,660 B2
(45) Date of Patent: Aug. 23, 2005

(54) PIEZOELECTRIC BENDER WITH INCREASED ACTIVATING FORCE, AND VALVE USING SAME

(75) Inventors: Jerome P. Maushard, Mapleton, IL (US); Larry G. Waterfield, Peoria, IL (US)

(73) Assignee: Caterpillar Inc, Peoria, IL (US)

( * ) Notice: Subject to any disclaimer, the term of this patent is extended or adjusted under 35 U.S.C. 154(b) by 75 days.

(21) Appl. No.: 10/164,968

(22) Filed: Jun. 6, 2002

(65) Prior Publication Data

US 2003/0227232 A1 Dec. 11, 2003

(51) Int. Cl.[7] .............................................. H01L 41/08
(52) U.S. Cl. ..................... 310/331; 310/328; 310/353; 251/129.06
(58) Field of Search ............................... 310/328, 331, 310/334, 353, 359; 251/129.06, 331

(56) References Cited

U.S. PATENT DOCUMENTS

| | | | |
|---|---|---|---|
| 4,647,013 A | * | 3/1987 | Giachino et al. ............ 251/331 |
| 5,004,945 A | * | 4/1991 | Tomita et al. .............. 310/328 |
| 5,482,213 A | * | 1/1996 | Matsusaka et al. ......... 239/584 |
| 6,024,340 A | | 2/2000 | Lazarus et al. |
| 6,297,579 B1 | * | 10/2001 | Martin et al. .............. 310/330 |
| 6,318,497 B1 | | 11/2001 | De Groot et al. |
| 6,376,969 B1 | | 4/2002 | Forck |
| 6,415,466 B1 | * | 7/2002 | Laiso .......................... 5/485 |
| 6,715,466 B2 | * | 4/2004 | Cotton et al. .............. 123/322 |

* cited by examiner

*Primary Examiner*—Thomas M. Dougherty
(74) *Attorney, Agent, or Firm*—Liell & McNeil

(57) ABSTRACT

A piezoelectric actuator includes at least one piezoelectric bender that is deformable between a first arcuate shape and a second arcuate shape that have different curvatures. A resistance device includes a moveable portion in contact with the piezoelectric bender throughout its deformation from the first shape to the second shape. In addition, the resistance device is operable to resist the deformation, preferably by resisting a change in the transverse dimension of the piezoelectric bender through a friction interaction. By resisting transverse dimension changes in the piezoelectric bender, the axial force produced by the actuator can be increased, and the same structure can compensate for wear that could otherwise undermine performance after many deformation cycles. The piezoelectric actuator finds particular application in fast valves, such as those associated with pressure switching in fuel injection systems.

22 Claims, 3 Drawing Sheets

PIEZOELECTRIC BENDER WITH INCREASED ACTIVATING FORCE, AND VALVE USING SAME

TECHNICAL FIELD

The present invention relates generally to piezoelectric bender actuators, and more particularly to a valve with a piezoelectric bender actuator that includes actuating force enhancement features.

BACKGROUND

Piezoelectric devices alter their shape in response to an applied electric field. An electric field applied in the direction of polarization affects an expansion of the piezoelectric material in the same direction, while a voltage applied in the opposite direction of polarization will cause a contraction of the material in that same direction. Piezoelectric devices, such as thermally pre-stressed benders, use the bending action of the bender to convert electrical energy into mechanical energy. In other words, when a voltage is applied across a piezoelectric bender, the bender flattens and produces an axial force. When an opposite voltage is applied, the piezoelectric bender increases its curvature, and produces an axial force in an opposite direction.

Engineers have observed that the magnitude of an axial force from a given piezoelectric bender is related to the stiffness of the bender. Stiffness can be adjusted by restricting the transverse expansion and contraction of the piezoelectric bender, such as by using a peripheral clamp of a type generally described in co-owned U.S. Pat. No. 6,376,969 to Forck. Forck seeks to increase stiffness of a piezoelectric bender by clamping around its peripheral edge. In addition, Forck compensates for temperature changes by including a temperature responsive element in its clamp, so that the piezoelectric bender operates similarly across a range of temperatures. Forck in essence teaches a static clamping load around the periphery of the piezoelectric bender. This static clamping load varies with temperature due to the inclusion of a temperature responsive element in the clamp.

More recently, engineers have observed that, due to geometrical changes occurring at the peripheral edge of the piezoelectric bender, that the clamp may not remain clamped to the piezoelectric bender throughout its deformation. The consequence of this phenomenon is a change in the stiffness of the piezoelectric bender at different points in its deformation, which results in decreased actuating forces from the piezoelectric bender, especially at the extreme deformation. In other words, as the piezoelectric bender flattens due to the application of an electrical voltage, the profile of the piezoelectric bender at the peripheral edge becomes slightly thinner due to that increasing flatness. That slight change in the profile thickness of the piezoelectric bender can be sufficient to cause one side or the other of the piezoelectric bender to lose contact with a clamping surface, resulting in a decreased resistance to the deformation, and hence a reduced actuating force from the piezoelectric bender.

Another potential problem associated with piezoelectric benders relates to wear at the surfaces where the peripheral edge of the piezoelectric bender comes in contact with a clamp surface or other housing surface. Over time, wear at these surfaces can also alter the geometry in the peripheral region, and hence alter the stiffness and performance of the piezoelectric bender. In extreme cases, the wear can become so severe that the piezoelectric bender becomes substantially unclamped over its entire deformation range, resulting in a relatively drastic reduction in the actuating force available. Thus, without some means for compensating for wear, the actuating force produced by a piezoelectric bender could gradually decrease over its operational lifetime, potentially undermining the operation of the device to which the piezoelectric bender is coupled. For instance, if the piezoelectric bender is used in conjunction with a valve, the loading of the valve member on a valve seat could gradually decrease over the lifetime of the piezoelectric bender, eventually resulting in valve seat loading that drops below that necessary to keep the valve seated.

The present invention is directed to overcoming one or more of the problems set forth above.

SUMMARY OF THE INVENTION

In one aspect, a method of increasing an axial force from a piezoelectric bender includes a step of resisting a change in a transverse dimension of the piezoelectric bender. This resistance is accomplished at least in part by following deformation of the piezoelectric bender with a deformation following portion of a resistance device. The resistance device might be a clamp, but could have other functionally equivalent features different from that produced by a clamp.

In another aspect, a piezoelectric actuator includes at least one piezoelectric bender that is deformable between a first shape and a second shape. A resistance device includes a moveable portion in contact with the piezoelectric bender throughout its deformation from its first shape to its second shape. The resistance device is operable to resist the deformation of the piezoelectric bender.

In still another aspect, a valve includes a moveable valve member at least partially positioned in a valve body that includes at least one fluid passage. A piezoelectric actuator is operably coupled to the valve member. The piezoelectric actuator includes at least one piezoelectric bender and a deformation following resistance device.

DETAILED DESCRIPTION

Figure 1:
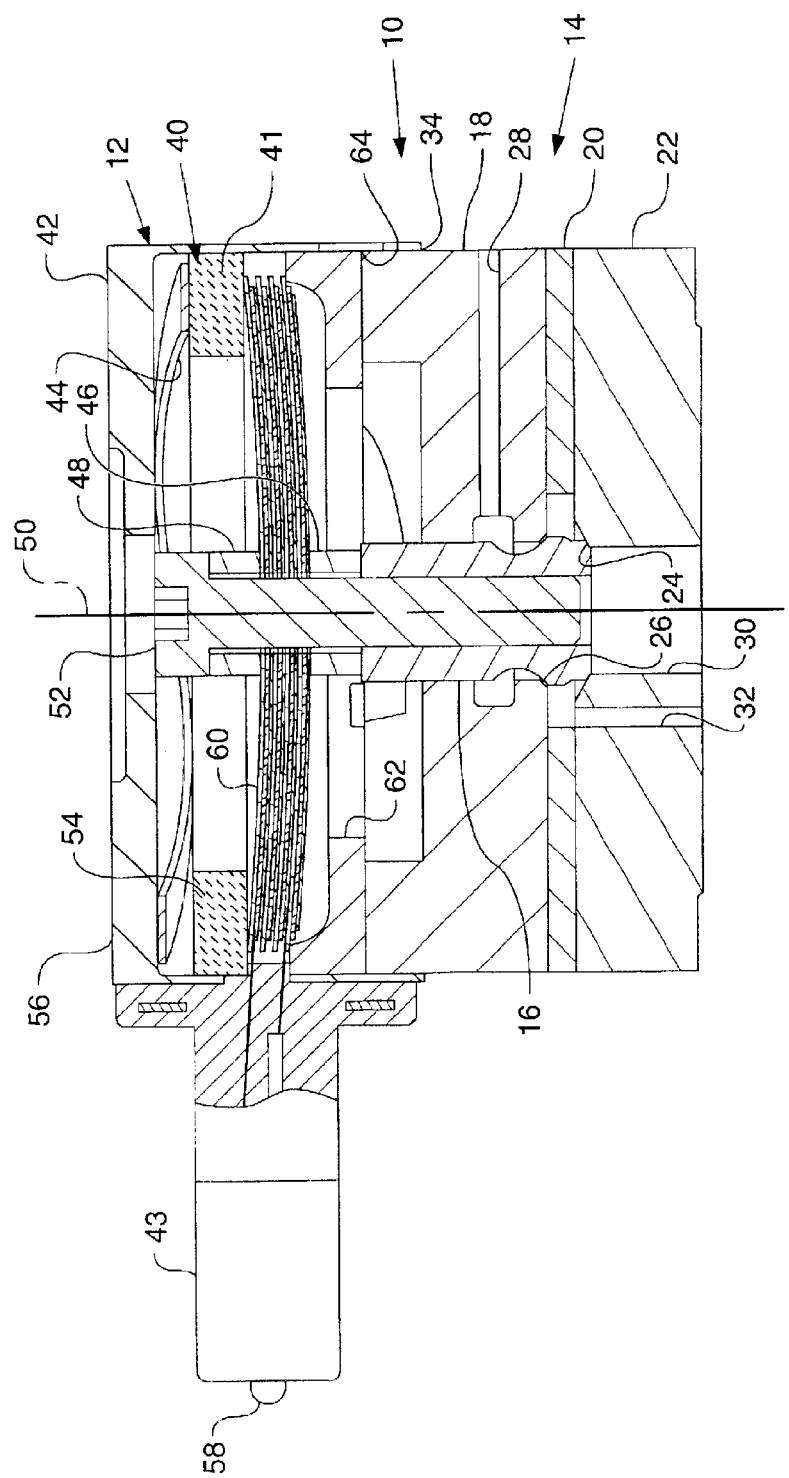
FIG. 1 is a sectioned side diagrammatic view of a valve with a piezoelectric actuator according to the present invention.

Referring now to FIG. 1, a valve 10 includes a piezoelectric actuator 12 that is operably coupled to move a valve member 16 that is positioned in valve body 14. Valve member 16 is normally biased downward into contact with a lower valve seat 24 by a pre-stress in piezoelectric benders 60 or by application of a negative voltage. When a sufficient voltage is applied across piezoelectric benders 60, valve member 16 is lifted to an upward position in contact with upper valve seat 26. In the illustrated example, the valve member travel distance is on the order of about 100 microns.

Valve 10 is illustrated as a three way poppet type valve, but it could be any type known in the art, including a ball valve member or a spool valve member. In addition, the valve could be a two way valve or a multi-way valve without departing from the present invention. In the illustrated example, when valve member 16 is in contact with lower seat 24, a high pressure passage 28 is fluidly connected to a control pressure passage 32. When valve member 16 is in contact with upper seat 26, control pressure passage 32 is blocked from high pressure passage 28, but open to low pressure passage 30.

The valve body 14 includes an upper seat component 18 separated from a lower seat component 22 by a valve lift spacer 20. Valve lift spacer 20 is preferably a category thickness part. This allows the travel distance of valve member 16 to be tightly controlled by choosing an appropriate thickness for lift spacer 20. As already discussed, high pressure passage 28, low pressure passage 30 and control pressure passage 32 are all disposed within valve body 14.

Piezoelectric actuator 12 preferably includes a housing 42 with an attached male electrical connector 43 that includes electrical contacts 58, which are arranged to produced an electric voltage across piezoelectric benders 60. Piezoelectric actuator 12 includes a deformation following resistance device 40, which in the illustrated example embodiment is a clamp 41. The deformation following portion of the clamp 41 includes a ceramic ring washer 54 that is biased into contact with a substrate layer of piezoelectric bender 60 via a ring shaped wave spring 44. An opposite side of a substrate layer of the bottom piezoelectric bender 60 bears against a steel ring 62, which is preferably ceramic coated. The clamping load produced by wave spring 44 can be preset by advancing ring 62 into a steel can portion 56 of housing 42 until a predetermined load is produced. At that point, ring 62 is preferably attached to can 56, such as by an annular weld at corner location 64. A fastener 52 is preferably attached to piezoelectric benders 60 via a pair of ceramic washers 46 and 48, and attached to valve member 16 via a threaded engagement. Thus, depending upon the polarization of the electrical voltage applied across piezoelectric bender 60, fastener 52, and hence valve member 16, will be driven with an axial force along a centerline 50. When this occurs, the diameter of piezoelectric benders 60 slightly change in a transverse direction, which is perpendicular to centerline 50. In the illustrated example embodiment, four piezoelectric benders 60 are stacked upon one another as part of actuator 12. Nevertheless, those skilled in the art will appreciate that depending upon the application, any number of one or more piezoelectric benders could be utilized without departing from the present invention. In addition, the piezoelectric benders 60 are shown as having a circular shape with an arcuate cross section that curves upward. Depending upon the application, the curvature of the arcuate shape could be adjusted and the perimeter shape of the piezoelectric benders could have shapes other than a circle, such as a rectangle or oval shape.

Figure 2:
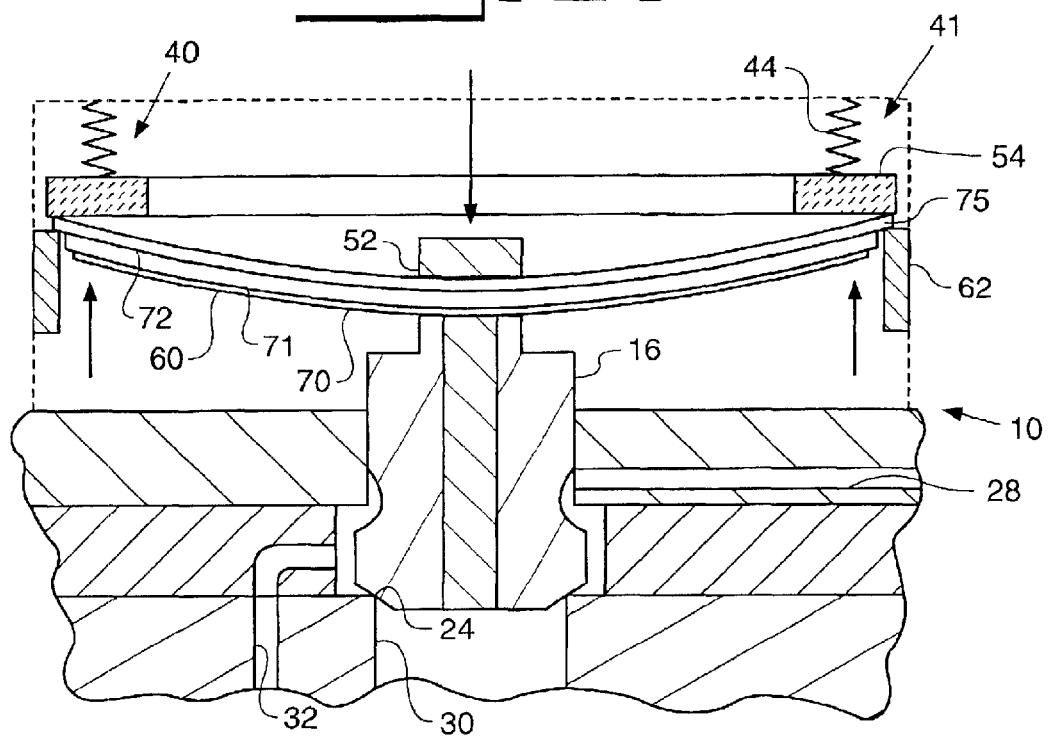
FIG. 2 is a sectioned side schematic view of the valve of FIG. 1 in a first state.
Figure 3:
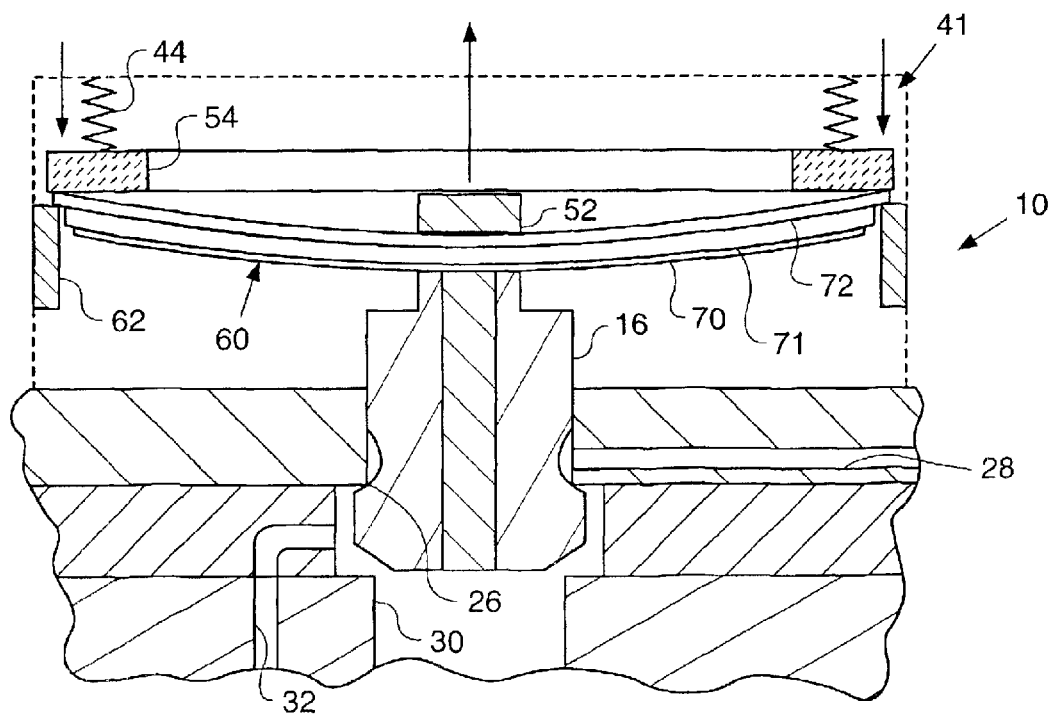
FIG. 3 is a sectioned side schematic view of the valve of FIG. 1 in a second state.

Referring now to FIGS. 2 and 3, schematic views show valve 10 in its first and second positions respectively. In addition, these figures are simplified in that only one piezoelectric bender is shown. In the illustrated example, each piezoelectric bender 60 includes an electrically conductive layer 70, which is preferably copper; an electrically active layer 71, which is preferably an electrically active ceramic material; and a substrate layer 72, which is also preferably an electrical conductor such as stainless or carbon steel. A voltage is applied across electrically active ceramic layer 71 by attaching electrical leads onto respective surfaces 70 and 72. These layers are preferably attached to one another via a suitable adhesive, and pre-stressed using known temperature or mechanical techniques to produce the arcuate shape shown. Various components are preferably ceramic or otherwise insulated, or coated with an insulated material in order to isolate valve member 16 and the valve body from the electricity supplied to piezoelectric bender 60. For instance, fastener 52 preferably has a ceramic coating or insulating sleeve, at least in the area of its top portion ordered to facilitate this electrical isolation. Nevertheless, those skilled in the art will appreciate that various other techniques could be utilized in order to isolate the electricity supplied to the piezoelectric bender from other components.

In the illustrated structure, clamp 41 preferably acts to distribute a clamping load around the outer perimeter 75 of the substrate layer 72, while preferably avoiding contact with the electrically active ceramic layer 71. When assembled, the piezoelectric benders 60 are preferably prestressed in order to provide a pre-loading force on valve member 16 against lower seat 24. Thus, when the valve is in the condition shown in FIG. 2, the outer edges of piezoelectric bender 60 produce upward forces on ring 54 in order to provide the downward pre-load force of valve member 16 on lower seat 24. Those skilled in the art will recognize that the outer upward force produced by piezoelectric bender 60 is less than the downward force produced by wave spring 44. If the force of wave spring 44 were insufficient, the piezoelectric bender would assume its rest arcuate shape and lift ring 54 against the action of wave spring 44, such that the load of valve member 16 onto seat 24 would be equal to the force from wave spring 44 alone. When the piezoelectric bender 60 is energized, its curvature tends to flatten and pull valve member 16 upward into contact with seat 26 as shown in FIG. 3. This flattening of piezoelectric bender 60 is resisted by the clamping force produced by clamp 41. This resistance to the change in the transverse dimension of piezoelectric bender 60 adds stiffness and hence increases the force of valve member 16 against seat 26. Thus, those skilled in the art will appreciate that the pre-load on wave spring 44, and hence the clamping load, should be chosen with some care in order to have an adequate seating load when valve 10 is in the configuration of FIG. 2, and also have a desired seating load when the valve is in the configuration of FIG. 3. In other words, the clamping load produced by wave spring 44 should be sufficiently high to prevent piezoelectric bender 60 from assuming its rest arcuate shape, yet not so high that the piezoelectric bender 60 is prevented from changing its transverse dimension when undergoing deformation.

Figure 4:
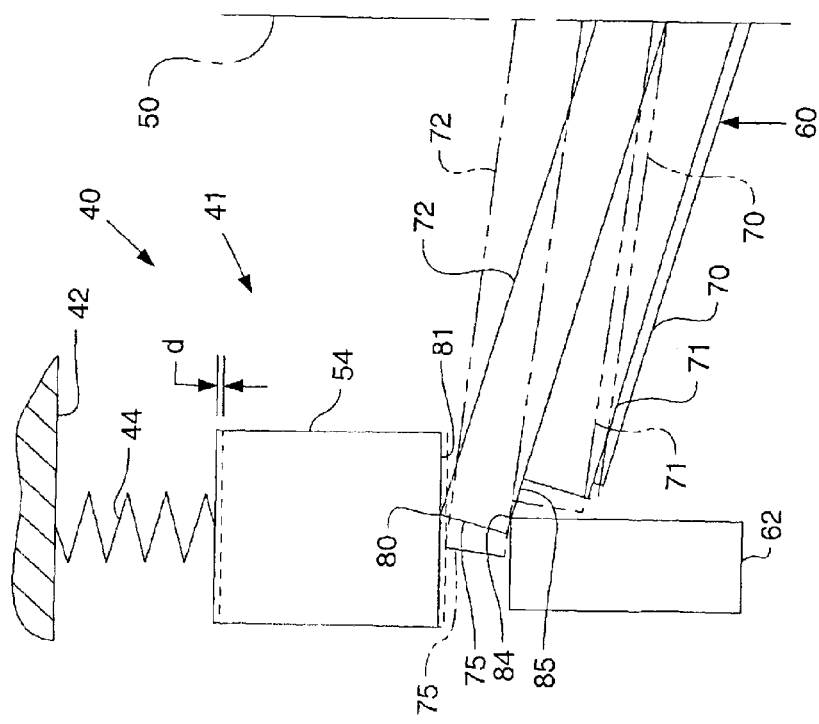
FIG. 4 is an enlarged sectioned side diagrammatic view of the peripheral edge portion of the piezoelectric bender of FIGS. 1–3.

Referring now to FIG. 4, an enlarged and greatly exaggerated illustration is useable in explaining how the deformation following clamp 41 interacts with the outer perimeter 75 of piezoelectric bender 60. The solid lines show the location of piezoelectric bender when valve 10 is in the configuration of FIG. 2, and the dotted lines show an exaggerated view of how the piezoelectric bender is shaped when valve 10 is in the configuration of FIG. 3. In this illustration, it should be noted that in the illustrated embodiment, housing 42 and ring 62 remain fixed in position when piezoelectric bender 60 undergoes its deformation. The resistance to deformation by piezoelectric bender 60 in either direction is accomplished by a friction interaction between corner 80 of substrate layer 72 with a friction surface 81 on ceramic ring washer 54, and a friction interaction between corner 84 of steel ring 62 with a friction surface 85 on substrate layer 72. This friction force resistance to deformation changes in piezoelectric bender 60 is maintained throughout that deformation since ceramic ring washer 54 follows the deformation by having the ability to move a distance d when piezoelectric bender 60 is moving between its first and second shapes. Although not necessary, the deformation following resistance device 40 is preferably organized and structured such that contact with electrically active ceramic layer 71 is avoided throughout the deformation process. This can avoid potentially damaging stresses to the relatively brittle ceramic material. Nevertheless those skilled in the art will appreciate that in other applications it might be desirable to accomplish the deformation resistance task through at least a partial contact interaction with the electrically active ceramic layer 71. Preferably, wave spring 44 is chosen such that the load it produces is relatively constant even when ring 54 moves through distance d.

Figure 5:
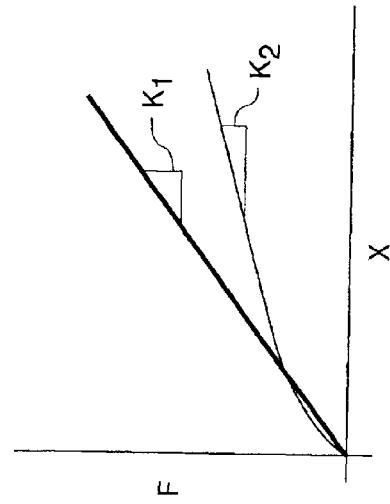
FIG. 5 is a graph of axial force verses deformation distance for a statically clamped piezoelectric bender and a dynamically clamped piezoelectric bender according to the present invention.

Referring now in addition to FIG. 5, the axial force produced by a piezoelectric bender can generally be described by the following formula:

$$F=Kx$$

where F is the axial force, K is a stiffness factor, and x is the axial displacement of the piezoelectric bender at centerline 50. The present invention seeks to manipulate the stiffness factor K, which can also be thought of as the ratio of force to displacement, so that K remains relatively constant over the deformation of piezoelectric bender 60. In FIG. 5, K1 is reflective of the present invention since clamp 41 provides a relatively uniform resistance to transverse dimension changes in piezoelectric bender 60. The second curve showing a stiffness factor K2 that changes with deformation represents an example curve when a static clamping load is utilized. When a static clamping load is utilized, the stiffness factor K can be relatively high when a small amount of deformation has occurred such that the clamp remains in contact with the piezoelectric bender, but as deformation continues, the clamping load continues to decrease, and hence the stiffness factor K2 decreases as the deformation of piezoelectric bender 60 increases.

INDUSTRIAL APPLICABILITY

The present invention finds potential application in any electrical actuator that utilizes one or more piezoelectric benders. The present invention finds particular application as an electrical actuator associated with fluid valves. In particular, the present invention has been illustrated in the context of a three way pressure switching valve, which is particularly applicable for use in fuel injection systems.

Although the present invention has been illustrated in which the deformation following resistance device 40 is a clamp that produces a clamping load parallel to the axial force produced by the piezoelectric bender 60, those skilled in the art will appreciate that other equivalent strategies could be used to resist changes in the transverse dimension of the piezoelectric bender. For instance, the geometry and orientation of the various friction surfaces 80, 81, 84 and 85 (FIG. 4) could be reoriented in any suitable manner to influence the stiffness factor in a desired manner throughout the deformation of the piezoelectric bender 60. In addition, the friction forces which cause the resistance to transverse dimension changes can be adjusted by both geometrical adjustments to the friction surfaces and/or by adjusting the smoothness of the materials as well as the materials themselves.

In addition, a different strategy might include the use of a ring mounted around the outer perimeter 75 of substrate layer 72 as a substitute for clamp 41. In such a case, the ring would be elastic and resistant to changes in its diameter, but would be sufficiently elastic that the piezoelectric bender could change in its transverse dimension. Nevertheless, the illustrated deformation following resistance device 40 is preferable since it has the ability to resist transverse dimension changes in piezoelectric bender 60 when deforming in either direction.

The structure of the deformation following resistance device 40 of the present invention is also preferable in that it has the ability to compensate for wear that is likely to occur at friction interaction surfaces 80, 81, 84 and 85 of FIG. 4. As these surfaces wear, wave spring 44 will maintain a desired clamping load by adjusting the position of ring 44 to maintain contact with substrate layer 72. Thus, the illustrated structure should have the ability to compensate for wear even after undergoing millions of deformation cycles with little or no degradation in performance.

Those skilled in the art will appreciate that other aspects, objects and advantages of this invention can be obtained from a study of the drawings, the disclosure and the appended claims.

What is claimed is:

1. A method of increasing an axial actuation force from a piezoelectric bender, comprising the step of:
   resisting a change in a transverse dimension of the piezoelectric bender at least in part by following deformation of the piezoelectric bender adjacent its perimeter with a deformation following portion of a resistance device; and
   the transverse dimension being transverse to a direction of the axial actuation force.

2. The method of claim 1 wherein the piezoelectric bender includes an arcuate shaped portion; and
   said change in a transverse dimension includes a change in a curvature of the arcuate shaped portion.

3. The method of claim 2 wherein the resistance device includes a clamp; and
   said resisting step includes a step of adjusting the clamp while changing the transverse dimension of the piezoelectric bender.

4. The method of claim 3 including a step of clamping the clamp to an outer edge of the piezoelectric bender.

5. The method of claim 3 including a step of orienting a clamping load in parallel with an axial actuation force.

6. The method of claim 1 wherein the piezoelectric bender includes a substrate layer attached to an electrically active ceramic layer; and
   said maintaining step includes a step of positioning the resistance device in contact with the substrate layer.

7. The method of claim 6 including a step of avoiding contact between the resistance device and the electrically active ceramic layer.

8. The method of claim 1 including a step of distributing a resistance load around the perimeter of the piezoelectric bender with the resistance device.

9. A piezoelectric actuator comprising:
   at least one piezoelectric bender that is deformable between a first shape and a second shape;
   a resistance device including a movable portion in contact with said piezoelectric bender adjacent its perimeter throughout a deformation from said first shape to said second shape, and being operable to resist a portion of said deformation in a direction transverse to an actuating direction.

10. The piezoelectric actuator of claim 9 wherein said piezoelectric bender includes an arcuate shaped portion.

11. The piezoelectric actuator of claim 10 wherein said resistance device includes a clamp in contact at a plurality of locations around said perimeter of said piezoelectric bender.

12. The piezoelectric actuator of claim 11 wherein said clamp includes a spring and a washer.

13. The piezoelectric actuator of claim 12 wherein said spring includes a ring shaped wave spring.

14. The piezoelectric actuator of claim 9 wherein said piezoelectric bender includes a substrate layer attached to a electrically active ceramic layer; and said movable portion is in contact with said substrate layer, but out of contact with said electrically active ceramic layer.

15. The piezoelectric actuator of claim 14 wherein said resistance device includes a clamp in contact at a plurality of locations around said perimeter of said piezoelectric bender; and said piezoelectric bender includes an arcuate shaped portion.

16. A valve comprising:

a valve body having at least one fluid passage disposed therein;

a movable valve member at least partially positioned in said valve body; and the piezoelectric actuator of claim 9 operably coupled to said valve member.

17. The valve of claim 16 wherein said piezoelectric bender includes an arcuate shaped portion.

18. The valve of claim 17 wherein said resistance device includes a clamp in contact at a plurality of locations around said perimeter of said piezoelectric bender.

19. The valve of claim 18 wherein said clamp includes a spring and a washer.

20. The valve of claim 19 wherein said spring includes a ring shaped wave spring.

21. The valve of claim 16 wherein said piezoelectric bender includes a substrate layer attached to a electrically active ceramic layer; and said movable portion is in contact with said substrate layer, but out of contact with said electrically active ceramic layer.

22. The valve of claim 21 wherein said resistance device includes a clamp in contact at a plurality of locations around said perimeter of said piezoelectric bender; and said piezoelectric bender includes an arcuate shaped portion.

* * * * *

UNITED STATES PATENT AND TRADEMARK OFFICE
CERTIFICATE OF CORRECTION

PATENT NO. : 6,933,660 B2
DATED : August 23, 2005
INVENTOR(S) : Maushard et al.

It is certified that error appears in the above-identified patent and that said Letters Patent is hereby corrected as shown below:

Column 6,
Line 48, delete "maintaining" and insert -- resistance --.

Column 7,
Line 23, delete "in" and insert -- to --.

Signed and Sealed this

Seventh Day of March, 2006

JON W. DUDAS
*Director of the United States Patent and Trademark Office*